United States Patent
Adolf et al.

(10) Patent No.: US 10,082,548 B2
(45) Date of Patent: Sep. 25, 2018

(54) CIRCUIT ARRANGEMENT FOR THE DRIVING ELECTRONICS OF A MAGNETIC RESONANCE SYSTEM

(71) Applicants: Holger Adolf, Zirndorf (DE); Rudi Baumgartl, Erlangen (DE); Nikolaus Demharter, Dormitz (DE); Jörg Ulrich Fontius, Neunkirchen A. Brand (DE); Rene Gumbrecht, Herzogenaurach (DE)

(72) Inventors: Holger Adolf, Zirndorf (DE); Rudi Baumgartl, Erlangen (DE); Nikolaus Demharter, Dormitz (DE); Jörg Ulrich Fontius, Neunkirchen A. Brand (DE); Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 675 days.

(21) Appl. No.: 14/645,215

(22) Filed: Mar. 11, 2015

(65) Prior Publication Data
US 2015/0260807 A1   Sep. 17, 2015

(30) Foreign Application Priority Data
Mar. 11, 2014   (DE) .......................... 10 2014 204 471

(51) Int. Cl.
| G01R 33/36 | (2006.01) |
| G01R 33/3415 | (2006.01) |
| G01R 33/561 | (2006.01) |

(52) U.S. Cl.
CPC ...... *G01R 33/3607* (2013.01); *G01R 33/3415* (2013.01); *G01R 33/5612* (2013.01)

(58) Field of Classification Search
USPC ................................................. 324/322, 228
See application file for complete search history.

(56) References Cited

U.S. PATENT DOCUMENTS

| 2002/0138001 A1* | 9/2002 | Kroeckel | ......... G01R 33/34084 600/410 |
| 2012/0188459 A1* | 7/2012 | Madonna | ............ H04L 12/2803 348/589 |

FOREIGN PATENT DOCUMENTS

WO    WO2012088065 A1    6/2012

OTHER PUBLICATIONS

German Office Action for related German Application No. 10 2014 204 471.5, dated Nov. 4, 2014, with English Translation.

\* cited by examiner

*Primary Examiner* — Vincent Q Nguyen
(74) *Attorney, Agent, or Firm* — Lempia Summerfield Katz LLC

(57) ABSTRACT

A circuit arrangement for driving a transmission coil arrangement with at least two individual transmission coils of a magnetic resonance system for supplying a radiofrequency signal for producing alternating electromagnetic fields over at least two channels, with in each case a digital section and an analog section, is provided. In the digital section, in an envelope generator, base frequency signals that respectively generate an envelope are provided. The circuit arrangement also includes an intermediate frequency oscillator that generates a common intermediate frequency, a frequency mixer per channel for mixing the common intermediate frequency into the base frequency signals, and in the analog sections of the channels, respectively, second frequency mixers that mix a common radiofrequency signal into each base frequency signal. The envelope is transmitted, with the mixed-in intermediate frequency signal, and the (Continued)

total signal thus obtained is respectively conducted to an individual transmission coil via a respective amplifier.

11 Claims, 2 Drawing Sheets

CIRCUIT ARRANGEMENT FOR THE DRIVING ELECTRONICS OF A MAGNETIC RESONANCE SYSTEM

This application claims the benefit of DE 10 2014 204 471.5, filed on Mar. 11, 2014, which is hereby incorporated by reference in its entirety.

BACKGROUND

The present embodiments relate to a circuit arrangement of driving electronics of a transmission coil arrangement.

Modem magnetic resonance systems (MR systems or else MRI systems) operate with the aid of transmission coil systems for emitting radiofrequency pulses to excite nuclear resonance and/or to receive induced magnetic resonance signals. An MR system may have a permanent magnet or a superconducting coil for producing a main magnetic field that is as homogeneous as possible in an examination area, at least one large whole-body coil arrangement permanently installed in the MR system. In order to read out electromagnetic signals and frequencies from which it is possible to produce images of a patient, gradient coils are used to produce magnetic field gradients in three axes that enable spatial coding relating to frequency information and phase information.

In order to excite the magnetic dipoles located in the examination object to emit MR signals, in addition to the whole-body coil arrangement, it is also possible to use local coil arrangements enabling the acquisition of images with a particularly high signal-to-noise ratio of selected areas of particular interest.

Both the whole-body coil arrangement and the local coil arrangements in most cases include a plurality of individual transmission coils that are intended to be driven as individually as possible. Such an MR system, which is intended to be able to drive the individual transmission coils of the whole-body coil arrangement as well as the local coil arrangement individually, correspondingly has a plurality of separate channels that are respectively connected to at least the whole-body coil arrangement and also the local coil arrangement, or even individually to the individual transmission coils present there.

MR systems thus equipped facilitate spatial influencing of the magnetic field that is used to excite the spinning system. If it is possible to drive the individual transmission coils completely independently at the MR frequency, new possibilities arise for improving image quality, for accelerating the measurement and for reducing the RF loading of the patient.

However, there is a problem of the outlay that increases with the number of the individual transmission coils, particularly with reference to the channels required in this case in the MR system in order to drive the transmission coils.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a circuit arrangement for transmission channels of a magnetic resonance (MR) system, and an MR system that enables a plurality of individually operable transmission channels for the connection of the individual transmission coils in conjunction with a reduced outlay on construction are provided.

If a plurality of channels for the individual operation of a plurality of individual transmission coils are implemented in the whole-body coil arrangement and/or the local coil arrangement in the MR systems presently known, an individual base frequency, which carries the envelope, is firstly mixed with an intermediate frequency in each channel. The intermediate frequency substantially determines the observed slice, although other contributions such as, for example, an "eddy current" compensation of 0th order may also be added. The intermediate frequency is varied dynamically with time. The frequency generation may be performed with the aid of a digital sound processor (DSP) that generates the baseband with the base frequency, and also has an intermediate frequency oscillator for generating the intermediate frequency. The two frequencies are subsequently mixed in a frequency mixer. In most cases, the first part of the frequency preprocessing takes place digitally, so that there is subsequently a need for digital-to-analog conversion. In the second, analog part of the frequency preprocessing, the analog mixed signal from base frequency and intermediate frequency is now mixed with a radiofrequency signal that is responsible for the excitation of the flip angle in order to generate the MR signal in the examination object. The total signal is amplified individually per channel and fed to the respective transmission coils.

The outlay on circuitry may be greatly reduced when there is no use of an intermediate frequency oscillator individually per channel in the first part of the frequency generation, but it is possible to load at least two channels in the first part of the frequency generation with the aid of a single intermediate frequency oscillator. At least two (e.g., all) transmission channels are thereby combined, so that the first part of the frequency generation is also implemented on base frequency and intermediate frequency by a single electronic component (e.g., a DSP). Subsequently, the individual mixed frequencies may be converted from analog to digital individually, and sent in amplified fashion separately to the transmission coils after the mixing of the radiofrequency.

A circuit arrangement of the driving electronics of a transmission coil arrangement with at least two individual transmission coils of a magnetic resonance system with a measurement region for the purpose of supplying a radiofrequency signal for producing alternating electromagnetic fields is provided. The circuit arrangement includes at least two channels for the respective individual drive of the at least two individual transmission coils, with in each case a digital and an analog section. The circuit arrangement also includes a base frequency signal that forms an envelope being generated in each case channelwise in the digital section of the channels based on control signals of a computer system of the MR system in a common envelope generator. The circuit arrangement includes a single intermediate frequency oscillator that generates a common intermediate frequency that determines a region to be observed in the measurement region of the magnetic resonance system. The circuit arrangement includes a first frequency mixer per channel for mixing the common intermediate frequency into the at least two base frequency signals. In addition, in each case in the analog section of the channels, which begins channelwise with a digital-to-analog converter, a second frequency mixer that respectively mixes a common radiofrequency signal into each base frequency signal, transmitting the envelope, with the mixed-in intermediate frequency signal is provided. The total signal thus obtained respectively is conducted to at least one individual transmission coil via a respective amplifier.

Owing to this configuration, the complete transmission chain of a simple MR system is no longer duplicated. Rather, the intermediate frequency is generated once and once only, and is mixed on a plurality of individual basebands.

In the case of the circuit arrangement, the envelope generator may be constructed from a field programmable gate array (FPGA).

The envelope generator for generating the base frequencies may include a digital sound processor or digital signal processor (DSP).

In addition to the circuit arrangement according to one or more of the present embodiments, a magnetic resonance system for producing magnetic resonance pictures (e.g., images) from at least one partial volume of an examination object is provided. The magnetic resonance system includes: an arrangement of magnet systems for producing a homogeneous main magnetic field and additional gradient fields for spatial coding; at least one transmission coil system having at least two individual transmission coils for producing alternating electromagnetic fields in order to induce a magnetic resonance signal in a prescribed partial volume of the examination object; and at least one receiver coil in order to measure the magnetic resonance signals emitted by the examination object. A computer system with control electronics that has a memory for storing computer programs that control the magnetic resonance system in operation and evaluate the measured magnetic resonance signals is also provided. The control electronics have at least two separately drivable channels. The at least two channels have an individual signal profile that results from mixing a base frequency for defining an envelope, an intermediate frequency for determining location, and a radiofrequency for deflecting the magnetization, therefore for generating the known flip angle in the examination object. According to one or more of the present embodiments, a common channel-bridging intermediate frequency oscillator is provided for generating the intermediate frequency.

In one embodiment, the at least two separately drivable channels respectively have a first frequency mixer for initially mixing the base frequency and the intermediate frequency. The at least two separately drivable channels may have a dedicated second frequency mixer per channel for further mixing in the radiofrequency.

The magnetic resonance system may also be configured such that at least one of the frequency mixers (e.g., the first frequency mixer) is configured as a digital frequency mixer. At least one of the frequency mixers may be configured as an analog frequency mixer.

In order to implement the magnetic resonance system in practice, at least one of the frequency mixers may be configured as a field programmable gate array (FPGA) or as an application-specific integrated circuit (ASIC).

The digital-to-analog converter may be arranged in each channel between the respective first frequency mixers and the respective second frequency mixers.

For the purpose of final amplification of the generated overall signal, a separate amplifier for each channel may be arranged downstream of the respective second frequency mixer.

The at least two channels of the magnetic resonance system may either separately drive a local coil system and a whole-body coil system, or a plurality of individual transmission coils that are respectively connected individually to one channel each or individually in at least two groups may be present in at least one of the transmission coil systems, and may therefore be driven individually.

The following reference symbols are used below: 1: MRI systems; 2: housing; 3: patient couch; 4: patients; 5: main magnets; 6: gradient magnet system; 7: whole-body coil system; 7.1-7.2: individual transmission coils of the whole-body coil system; 8: mobile local coil system; 8.1-8.3: individual transmission coils of the local coil system; 9: MR images; 10: computer system; 11: control and data lines; 12.1-12.4: DSP; 13: envelope modulator; 14.1-14.4: intermediate frequency oscillator; 15.1-15.4: frequency mixer; 16.1-16.4: DAC; 17.1-17.4: frequency mixer; 18.1-18.4: amplifier; 19: envelope memory; $K_1$-$K_4$: channel; $B_0$: homogeneous magnetic field; $B_1$: alternating electromagnetic field; $BG_x$, $BG_y$, $BG_z$: gradient fields in three main directions; $Prg_1$-$Prg_n$: computer program.

DETAILED DESCRIPTION

Figure 1:
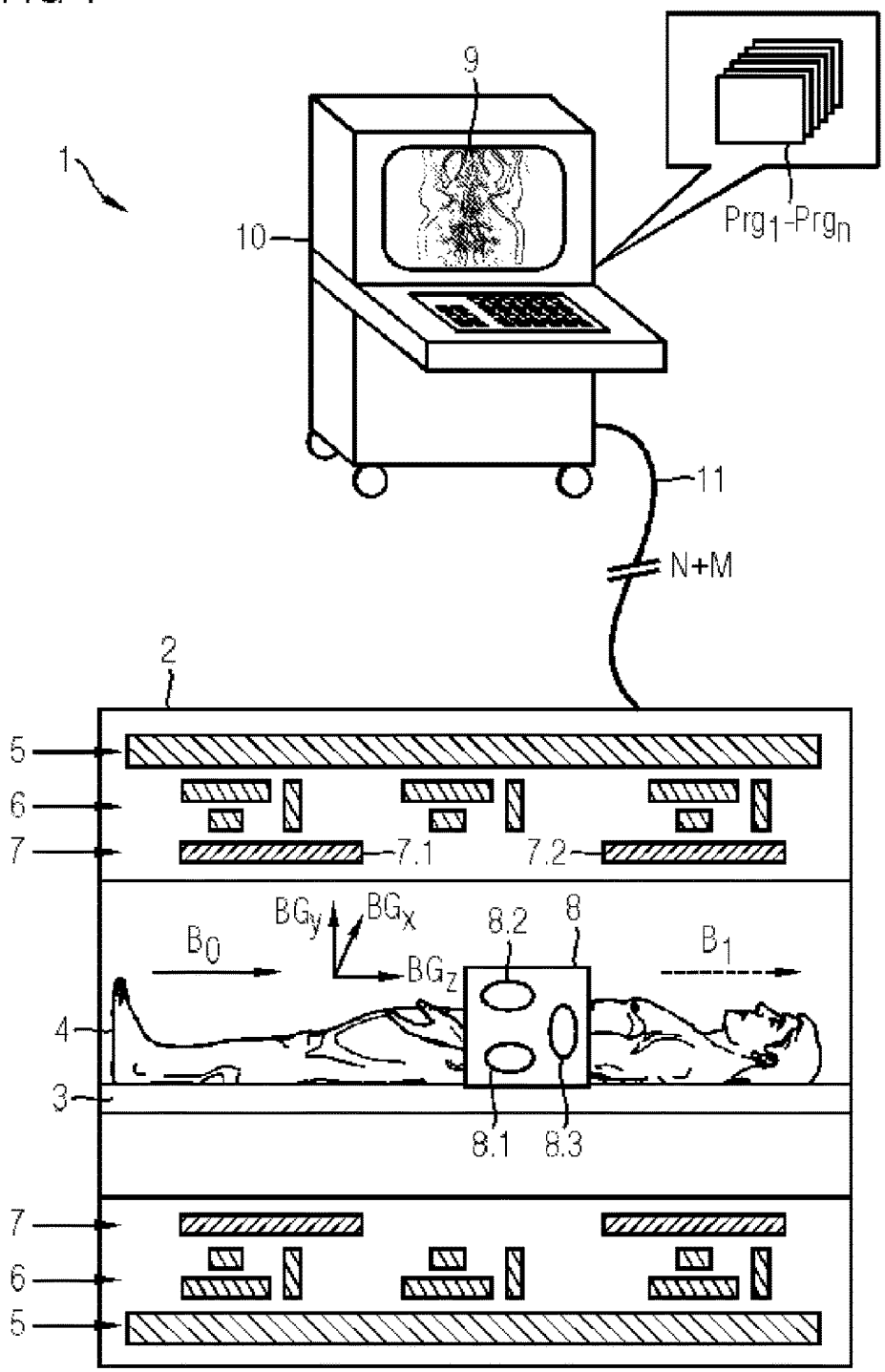
FIG. 1 shows one embodiment of a magnetic resonance imaging (MRI) system with individually drivable individual coils of the whole-body coil system and of the local coil system.

FIG. 1 is a schematic of one embodiment of a magnetic resonance imaging (MRI) system 1 having a housing 2 in which a patient couch 3 with a patient 4 is located for the purpose of magnetic resonance (MR) examination. Arranged in the housing 2 are the typical magnetic systems of an MRI system, which have a main magnet 5 that produces a largely homogeneous magnetic field $B_0$ in the measurement region of the MRI system. Additional gradient magnet systems 6 are used to produce gradient fields in three main directions $BG_x$, $BG_y$, $BG_z$ for the purpose of spatial coding of the induced MR signals.

The generation of an alternating electromagnetic field $B_1$ that induces the MR signals in the patient is served by the whole-body coil system 7 installed fixedly in the housing and having the two individual transmission coils 7.1 and 7.2 and by a mobile local coil system 8 that has a plurality of individual coils 8.1 to 8.3. In the example shown, the local coil system 8 is arranged in the region of the abdomen of the patient 4, since the region is of particular interest (ROI) in the present case. Within the scope of the present embodiment, other regions may also be equipped with appropriately configured local coil systems, or else a plurality of regions with local coil systems at the same time. A further typical example for such an ROI is the region of the spinal column. By way of example, a plurality of individual transmission coils may be arranged for this purpose in the patient couch 3 along the normal positioning of the spinal column of the patient 4.

A computer system 10, which is connected to the magnet systems 5, 6 and, for example, to the individual transmission coils 7.1-8.3 via a plurality of control and data lines 11, is provided for controlling the MRI system 1, including the evaluation of the received MR signals, the reconstruction of tomographic MR images and the display of MR images 9. According to the present embodiment, the computer system 10 has at least two (e.g., five) individually drivable channels for controlling the N individual transmission coils 7.1 and 7.2 of the whole-body coil system 7, and the M individual transmission coils 8.1 to 8.3 of the mobile local coil system 8 that then produce the alternating electromagnetic field $B_1$ during the simultaneous individual pTx operation. In the example illustrated, the control electronics are integrated in the computer system 10 and have N+M channels having a circuit arrangement that corresponds to the circuit arrangement shown in the following FIG. 3.

For the purpose of operating the MRI system 1 including the driving of the magnetic coil systems and also of analyzing the MR signals accompanied by the reconstruction of the MRI images, the computer system 10 has a memory in which computer program codes are stored in the form of a number of computer programs $Prg_1$-$Prg_n$.

As described above, the individual drivability of the individual transmission coils enables the homogenization of the alternating electromagnetic field $B_1$ generated by the coils through appropriate adaptation of oscillation amplitudes and the phases of the individual coils. Fitting of the envelopes (e.g., adaptation in the baseband) is performed, for example, in the channels for the individual transmission coils. The individual drivability of the transmission coils may also be used to influence the pulse shape thereof and, in supplementary fashion, at the same time also to vary the gradient fields so as overall to induce as uniform as possible an MR signal over the measurement region.

Figure 2:
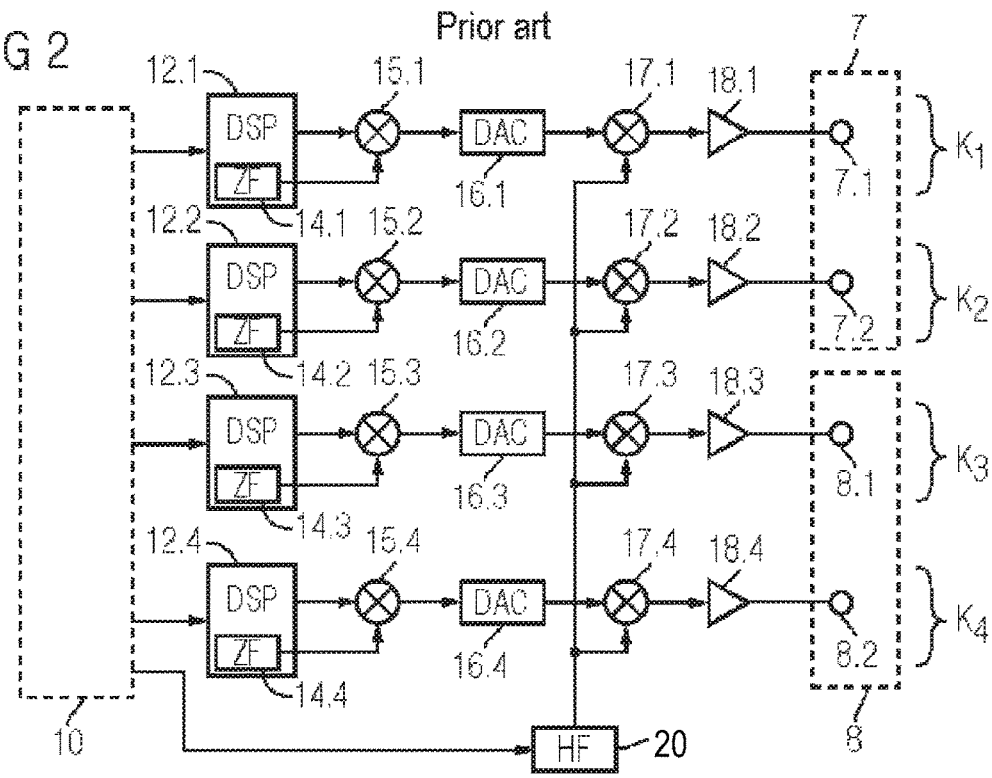
FIG. 2 shows known variant embodiments of a circuit arrangement for individually driving a plurality of individual transmission coils of an MRI system with four separate channels.
Figure 3:
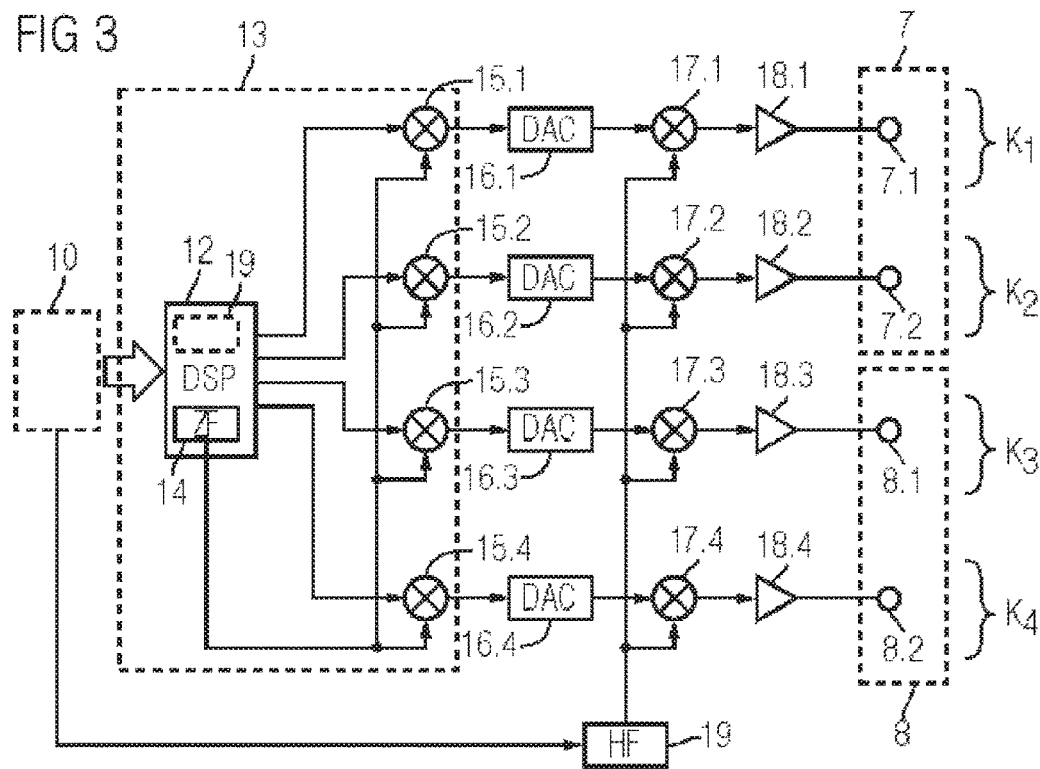
FIG. 3 shows an example of a circuit arrangement for individually driving four individual transmission coils of an MRI system with a common intermediate frequency oscillator.

For the purpose of better illustration of the difference between a known embodiment of a circuit arrangement having a plurality of individually adaptable channels and the circuit arrangement according to one or more of the present embodiments, FIG. 2 shows an exemplary embodiment of the prior art, and FIG. 3 illustrates a simplified circuit arrangement appropriately improved in accordance with one or more of the present embodiments.

In accordance with the total of four channels $K_1$-$K_4$, shown in parallel, emerging from the computer system 10, in FIG. 2, four DSPs 12.1-12.4, arranged in parallel, are provided with the requisite individual information for the purpose of generating four base frequencies with the desired individual envelopes (e.g., sinc envelopes). Located in each of the four DSPs 12.1-12.4 is an intermediate frequency oscillator 14.1-14.4 in which there is respectively generated over all DSPs the same intermediate frequency ZF that determines the slice offset of the volume in the patient that is excited to magnetic resonance. Downstream of the DSPs 12.1-12.4, the base frequency and the intermediate frequency are mixed per channel $K_1$-$K_4$ via the frequency mixers 15.1-15.4, after which there is digital-to-analog conversion via the DACs 16.1 to 16.4. The analog part of the channels $K_1$-$K_4$ begins here. The now analog signals are then conducted channelwise to a further frequency mixer 17.1-17.4 in which the radiofrequency HF from the radiofrequency oscillator 20 is mixed in. Subsequently, the power of the signals is amplified via the amplifiers 18.1-18.4 so that it is then possible in the individual channels to feed to the individual transmission coils 7.1, 7.2 of the whole-body coil system 7 and the individual transmission coils 8.1, 8.2 of the local transmission coil system 8.

In order to simplify the known circuit arrangement, a fundamental change to the first digital section of the channels is provided while keeping the analog second section of the channels still unchanged. Such an embodiment of the circuit arrangement in accordance with one or more of the present embodiments is shown by way of example in FIG. 3. Starting from the computer system 10, a single DSP 12 is supplied with all the requisite individual information for the purpose of generating four base frequencies with the desired individual envelopes. This DSP 12, which may, for example, be implemented as an ASIC or FPGA, generates the base frequencies with respective individual envelope for all four channels $K_1$-$K_4$. A single intermediate frequency ZF is generated. This may be done in the DSP 12 (e.g., by the intermediate frequency oscillator 14 integrated there). The base frequencies of the individual channels and the intermediate frequency are then combined via the frequency mixers 15.1 to 15.4 and conducted channelwise to one DAC 16.1-16.4 each and transformed there into analog signals. The complex of the single DSP 12 with the intermediate frequency oscillator 14 and the digital frequency mixer 15.1 to 15.4 thereby forms a component in the form of an envelope modulator 13 that, by way of example, may be implemented overall by an ASIC or by an FPGA. The further processing of the signals is performed starting from the DACs in accordance with FIG. 2. The radiofrequency HF is thereby mixed in via the frequency mixers 17.1-17.4, amplified via the amplifiers 18.1-18.4 and fed channelwise to the individual transmission coils 7.1, 7.2 and 8.1, 8.2.

Thus, the configuration according to one or more of the present embodiments yields a substantial simplification of the circuit arrangement in conjunction with driving the individual transmission coils of an MR system in individual channels such as is shown, for example, in FIG. 1.

Thus, in accordance with one or more of the present embodiments, most of the components of the digital transmission chain are no longer duplicated unnecessarily as before. For example, the intermediate frequency, which is identical for each transmission channel, is not generated multiply. The result of this is that the digital intermediate frequency ZF is generated without change by standard components, but without modulation of RF pulse shapes. As a result, both the intermediate frequency and the RF pulse timing are defined. The resulting signal is transmitted no longer to the DAC, but to a digital component, the envelope modulator. The RF pulse shapes for all transmission channels are received digitally in the baseband from the driving program by the modulator. For this purpose, the driving program is widened, and an interface to the envelope modulator is provided. In order to mix the frequencies, the envelope modulator executes a complex multiplication of the intermediate frequency signal by the baseband signal of the individual channels and outputs the result in the DAC of the respective transmission channel.

In supplementary fashion, an envelope memory 19 that stores a limited number of predefined envelopes, which the envelope memory 19 outputs under the control of the driving program, is provided in the envelope modulator. This reduces the demands placed on the communication interface between the controlling computer program present in the computer system 10 and the envelope modulator 13.

The use of such an envelope modulator 13 minimizes the outlay on development for upgrading a conventional MR system for a plurality of transmission channels. No novel components are required in addition to the envelope modulator 13 and a corresponding interface with the computer system 10. The envelope modulator 13 itself includes only a very simple logic that may, for example, be implemented in an FPGA.

Only low costs occur for upgrading existing systems, since all the components may continue to be used. A simple access to the digital and analog RF signal is possible because discrete components are used.

Thus, overall, the present embodiments provide a circuit arrangement for driving a transmission coil arrangement with at least two individual transmission coils of a magnetic resonance system for supplying a radiofrequency signal for producing an alternating electromagnetic field via at least two channels ($K_1$-$K_4$) each having a digital section and an analog section. The circuit arrangement includes base frequency signals that respectively form an envelope being generated in an envelope generator in the digital section, a single intermediate frequency oscillator that generates a common intermediate frequency, and a frequency mixer per channel for mixing the common intermediate frequency into the base frequency signals. In the analog section of the channels, a respective second frequency mixer mixes a respective common radiofrequency signal into a respective base frequency signal. The envelope is transmitted with the mixed-in intermediate frequency signal, and the total signal thus obtained is respectively conducted to at least one individual transmission coil via a respective amplifier. In one or more of the present embodiment, a magnetic resonance system including such a circuit arrangement is provided.

Although the invention has been illustrated and described in detail by the exemplary embodiments, the invention is not limited by the disclosed examples. Other variations may be derived herefrom by the person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance system for producing magnetic resonance images from at least one partial volume of an examination object, the magnetic resonance system comprising:

an arrangement of magnet systems operable to produce a homogeneous main magnetic field and additional gradient fields for spatial coding;

at least one transmission coil system comprising at least two individual transmission coils operable to produce alternating electromagnetic fields in order to induce a magnetic resonance signal in a prescribed partial volume of the examination object;

at least one receiver coil operable to measure the magnetic resonance signals emitted by the examination object; and a computer system comprising control electronics including a memory for storing computer programs that control the magnetic resonance system in operation and evaluate the measured magnetic resonance signals, wherein the control electronics comprise at least two separately drivable channels, and the at least two separately drivable channels have an individual signal profile that results from first mixing a base frequency for defining an envelope and an intermediate frequency for determining location, and then mixing the base frequency and mixed-in intermediate frequency with a radiofrequency for deflecting the magnetization, wherein a common intermediate frequency oscillator is present across channels for generating the intermediate frequency.

2. The magnetic resonance system of claim 1, wherein the at least two separately drivable channels respectively have a first frequency mixer for initially mixing the base frequency and the intermediate frequency.

3. The magnetic resonance system of claim 1, wherein the at least two separately drivable channels have a dedicated second frequency mixer per channel for further mixing in the radiofrequency.

4. The magnetic resonance system of claim 1, wherein at least one frequency mixer of the first frequency mixers and the second frequency mixers is configured as a digital frequency mixer.

5. The magnetic resonance system of claim 1, wherein at least one frequency mixer of the first frequency mixers and the second frequency mixers is configured as an analog frequency mixer.

6. The magnetic resonance system of claim 1, wherein at least one frequency mixer of the first frequency mixers and the second frequency mixers is configured as a field-programmable gate array (FPGA).

7. The magnetic resonance system of claim 1, wherein at least one frequency mixer of the first frequency mixers and the second frequency mixers is configured as an application-specific integrated circuit (ASIC).

8. The magnetic resonance system of claim 1, wherein a digital-to-analog converter (DAC) is arranged in each channel between the respective first frequency mixers and the respective second frequency mixers.

9. The magnetic resonance system of claim 1, wherein an amplifier is arranged in each channel downstream of the respective second frequency mixers.

10. The magnetic resonance system of claim 1, wherein the at least one transmission coil system is configured as a movable local coil system.

11. The magnetic resonance system of claim 1, wherein the at least one transmission coil system is configured as a permanently installed whole-body coil system.

* * * * *